United States Patent
Cai

(10) Patent No.: US 10,693,067 B2
(45) Date of Patent: Jun. 23, 2020

(54) TOUCH SENSOR AND FABRICATING METHOD THEREOF AND TOUCH DISPLAY PANEL

(71) Applicants: SHANGHAI TIANMA MICRO-ELECTRONICS CO., LTD., Shanghai (CN); TIANMA MICRO-ELECTRONICS CO., LTD., Shanghai (CN)

(72) Inventor: Yu Cai, Shanghai (CN)

(73) Assignees: SHANGHAI TIANMA MICRO-ELECTRONICS., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 99 days.

(21) Appl. No.: 15/654,498

(22) Filed: Jul. 19, 2017

(65) Prior Publication Data
US 2017/0315641 A1    Nov. 2, 2017

(30) Foreign Application Priority Data
Dec. 23, 2016  (CN) .......................... 2016 1 1207575

(51) Int. Cl.
| H01L 21/44 | (2006.01) |
| H01L 51/00 | (2006.01) |
| H01L 27/32 | (2006.01) |
| H01L 27/12 | (2006.01) |

(Continued)

(52) U.S. Cl.
CPC .......... *H01L 51/0004* (2013.01); *G06F 3/044* (2013.01); *G06F 3/0412* (2013.01); *G06F 3/0416* (2013.01); *H01L 27/1292* (2013.01); *H01L 27/323* (2013.01);
(Continued)

(58) Field of Classification Search
CPC ...... G06F 3/044; G06F 3/0412; G06F 3/0416; G06F 2203/04112; G06F 2203/04103; H01L 27/323; H01L 27/1292; H01L 51/0022; H01L 51/0004
See application file for complete search history.

(56) References Cited

U.S. PATENT DOCUMENTS 10,026,624 B2 *  7/2018  Kurihara ............... H01L 21/486
2009/0166612 A1 *  7/2009  Cain ................... H01L 51/0022
                                                           257/40

(Continued)

FOREIGN PATENT DOCUMENTS

CN             100566509 C        12/2009

*Primary Examiner* — Shouxiang Hu
(74) *Attorney, Agent, or Firm* — Alston & Bird LLP

(57) ABSTRACT

The present application provides a touch sensor and a fabricating method thereof and a touch display panel, comprising: a substrate, where the substrate includes a plurality of grooves which are strip-shaped and intersected with each other to define a grid shape; a first infiltrating adjustment layer, disposed on an inside wall of the grooves; and a touch electrodes filled in the groove. The first infiltrating adjustment layer is positioned between the groove and the touch electrodes. An infiltration angle between the touch electrodes in solution state and the first infiltrating adjustment layer is α, an infiltration angle between the touch electrodes in solution state and the substrate is β, wherein α is not equal to β.

15 Claims, 11 Drawing Sheets

(51) Int. Cl.
    *G06F 3/041*     (2006.01)
    *G06F 3/044*     (2006.01)

(52) U.S. Cl.
    CPC ............... *H01L 51/0022* (2013.01); *G06F 2203/04103* (2013.01); *G06F 2203/04112* (2013.01)

(56) References Cited

U.S. PATENT DOCUMENTS

| | | | | |
|---|---|---|---|---|
| 2010/0305673 | A1* | 12/2010 | Jolly | A61N 1/05 607/116 |
| 2015/0092359 | A1* | 4/2015 | Kim | G06F 1/1643 361/748 |
| 2016/0139703 | A1* | 5/2016 | Tsai | G06F 3/044 345/174 |

\* cited by examiner

TOUCH SENSOR AND FABRICATING METHOD THEREOF AND TOUCH DISPLAY PANEL

CROSS-REFERENCES TO RELATED APPLICATIONS

This application claims priority to a Chinese patent application No. CN 201611207575.6 filed on Dec. 23, 2016 and entitled "TOUCH SENSOR AND FABRICATING METHOD THEREOF AND TOUCH DISPLAY PANEL", the disclosure of which is incorporated herein by reference in its entirety.

TECHNICAL FIELD

The present application relates to the field of display technologies, and more particularly, to a touch sensor and a fabricating method thereof and a touch display panel.

BACKGROUND

For an organic light-emitting diode of a flexible display panel to realize a touch function, it is currently required to laminate one layer in the touch module. However, the lamination tends to thicken the flexible display panel. To realize the light weight and slim design of a touch-type flexible display panel, an integrated technology is applied to replace the traditional module laminating technology.

The existing integrated technology are classified into the following two types. In the first type, a touch electrodes is integrated into one of a protective film layer, a polarizer or a glass cover plate. This technique is relatively more preferred than thinning a flexible display product to a specified requirement.

In the other type: a touch electrodes is integrated onto a surface of a thin-film encapsulation layer. In this process, the touch electrodes needs to be subjected to photoetching and wet etching processes. However, a yellow light effect and the like in the photoetching process can damage a light-emitting layer of an organic light-emitting display panel, and acidic or alkali chemicals used during a wet etching process may easily damage the thin-film encapsulation layer.

SUMMARY

The present disclosure provides a touch sensor in a touch display panel and a fabricating method which reduces difficulties in making the touch sensors, therefore enhancing a connection reliability of the touch electrodes, and avoiding damages touch electrodes to the thin-film encapsulation layer and the light-emitting element in an organic light emitting display panel, thereby improving an operational reliability of the organic light emitting display panel.

In a first aspect, an embodiment of the present disclosure provides a touch sensor, including: a substrate, where the substrate includes a plurality of grooves which are strip-shaped and interested with each other to define a grid shape;

a first infiltrating adjustment layer, disposed on an inside wall of each of the plurality of grooves; and a touch electrode filled in a groove, the first infiltrating adjustment layer is positioned between the groove and the touch electrode, an infiltration angle between the touch electrodes in solution state and the first infiltrating adjustment layer is $\alpha$, and an infiltration angle between the touch electrodes in solution state and the substrate is $\beta$, wherein $\alpha$ is not equal to $\beta$.

The touch electrodes in solution state is solution formed by dissolving electrode material of the touch electrodes into an organic solvent.

In a second aspect, an embodiment of the present disclosure further provides a touch display panel, which includes: a light-emitting element layer and a thin-film encapsulation layer covering the light-emitting element layer, and the touch sensor is directly formed on a surface of the thin-film encapsulation layer.

In a third aspect, an embodiment of the present disclosure further provides a method for fabricating a touch sensor, including: forming a substrate;

forming a plurality of grooves which are strip-shaped on a surface of the substrate, where the plurality of grooves are interested with each other to define a grid shape;

forming a first infiltrating adjustment layer, where the first infiltrating adjustment layer is formed on an inside wall of the grooves; and forming a touch electrodes, where the touch electrodes are filled in the grooves, and the first infiltrating adjustment layer is positioned between the grooves and the touch electrodes.

An infiltration angle between the touch electrodes in solution state and the first infiltrating adjustment layer is $\alpha$, and an infiltration angle between the touch electrodes in solution state and the substrate is $\beta$, wherein the $\alpha$ is not equal to the $\beta$.

The touch electrodes in solution state is a solution formed by dissolving an electrode material of the touch electrodes into an organic solvent.

The embodiments of the present disclosure provide a touch sensor and a fabricating method thereof and a touch display panel. A grooves is disposed on a substrate of the touch sensor, touch electrodes are formed in the grooves, and before forming the touch electrodes, a first infiltrating adjustment layer is disposed on inside walls of the grooves. An infiltration angle between the touch electrodes in solution state and the first infiltrating adjustment layer is not equal to an infiltration angle between the touch electrodes in solution state and the substrate, so that the touch electrodes in solution state has different infiltrating characteristics with respect to the grooves and the substrate surface. therefore, a better control of forming of the touch electrodes can be implemented, a difficulty in fabricating the touch electrodes is reduced, a process stability of the touch electrodes is enhanced, the touch electrodes are allowed to be evenly spread in the grooves, and a possibility of disconnection of the touch electrodes is greatly reduced, thereby improving a touch reliability of the touch electrodes.

DETAILED DESCRIPTION OF THE EMBODIMENTS

Figure 1A:
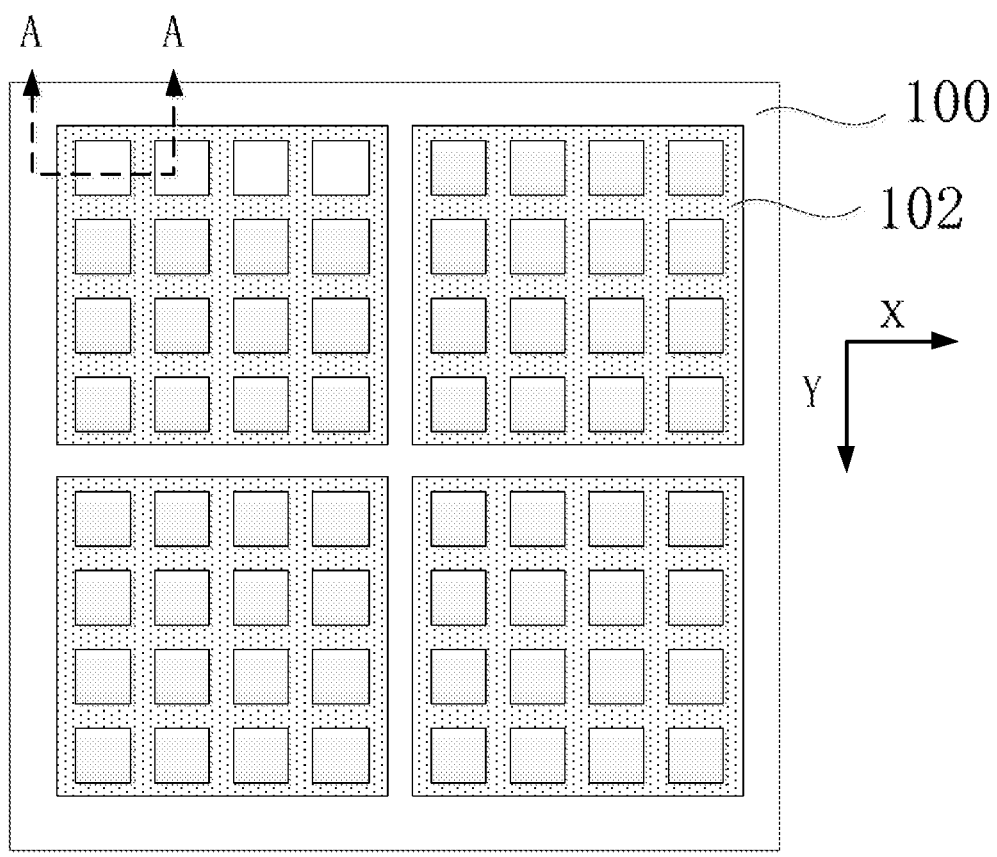
FIG. 1A is a top view of a touch sensor according to an embodiment of the present disclosure.

The present disclosure is further described in detail in the following with reference to the accompanying drawings and embodiments. It is to be understood that the embodiments set forth herein are merely intended to interpret the present disclosure and are not intended to limit the present disclosure. In addition, it is also to be noted that for ease of description, drawings merely show parts related to the present disclosure instead of all parts. Furthermore, the same reference numeral is used in different accompanying drawings to give a clearer description.

An embodiment of the present disclosure provides a touch sensor, including: a substrate, where the substrate includes a plurality of grooves which are strip-shaped and intersected with each other to define a grid shape;

a first infiltrating adjustment layer, disposed on an inside wall of each of the plurality of grooves; and a touch electrodes filled in the grooves, where the first infiltrating adjustment layer is positioned between the groove and the touch electrodes.

An infiltration angle between the touch electrodes in solution state and the first infiltrating adjustment layer is $\alpha$, and an infiltration angle between the touch electrodes in solution state and the substrate is $\beta$, wherein $\alpha$ is not equal to $\beta$.

The touch electrodes in solution state refers to a solution state formed by dissolving an electrode material of the touch electrodes into a solvent. Optionally, the solvent may be an organic solvent, which may be one or more of ethyl cellulose, cellulose nitrate, polyvinyl acetate, ketone resin and polyphthalein amine resin. It is to be noted that the touch electrodes in solution state are hereinafter referred to as "electrode material solution".

Generally, the touch electrodes of the touch sensor is directly formed on the surface of the substrate of the touch sensor. The material of the touch electrodes includes transparent indium tin oxide. However, in a flexible display panel, a metal grid electrode having good flexibleness and lower impedance may be used so as to enhance the bending resistance of the touch electrodes. The fabricating process of a metal grid may adopt a technique of screen printing directly using metal ink. Alternatively, the metal may be coated as a thin film on the substrate and then any redundant components are washed away via a yellow light photolithography process to generate the grid. No matter which technique is used, the above manners may cause a negative impact on the light-emitting element if the metal grid electrode is directly formed inside the organic light emitting display panel.

In the embodiments of the present disclosure, the touch electrodes are formed in the grooves on the substrate by means of inkjet printing, electrode material of the touch electrodes may be metal, the electrode material of the touch electrodes is dissolved into an organic solvent to form electrode material solution of the touch electrodes, then the electrode material solution is jetted and printed into the grooves of the substrate. Liquid entering into the grooves rapidly flows along inside walls of the grooves to form a uniform electrode shape, and is then cured, and the organic solvent vaporizes afterwards. In this way, the touch electrodes are formed as a result. In the embodiments of the present disclosure, before the electrode material solution is jetted and printed into the grooves, a first infiltrating adjustment layer is disposed on the inside walls of the grooves. The first infiltrating adjustment layer can regulate infiltrating characteristics of the electrode material solution and the grooves. In this way, a flow rate and a spreading uniformity of the electrode material solution in the grooves are regulated and controlled, the uniformity of the formed touch electrodes is guaranteed, a possibility of breakingup of the touch electrodes is reduced, each touch electrodes is ensured to have a uniform electrical impedance, and a touch performance of the touch sensor is improved.

Figure 1B:
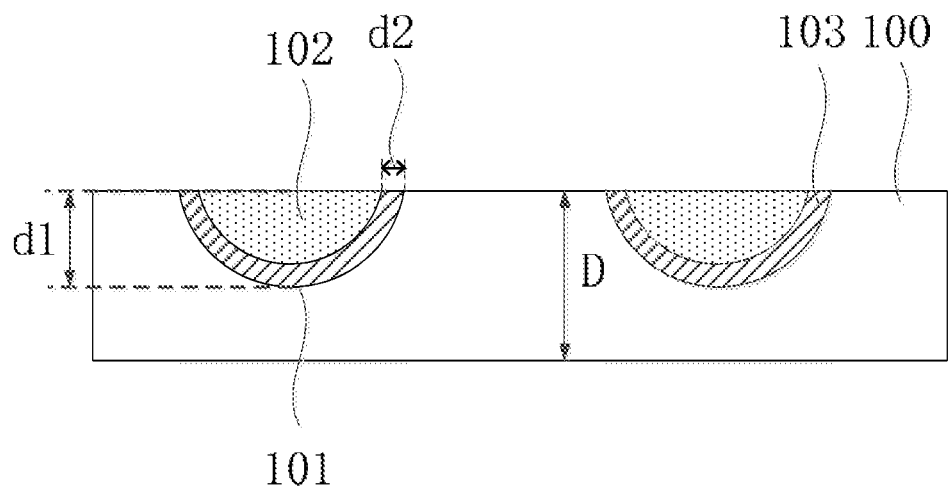
FIG. 1B is a cross sectional view taken along AA of FIG. 1A.
Figure 2A:
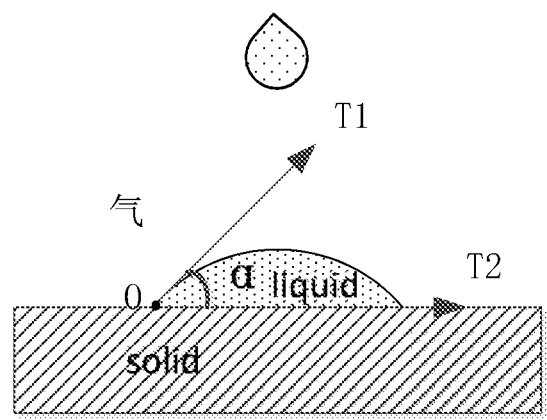
FIG. 2A is a schematic diagram of an infiltration angle $\alpha$ between the touch electrodes in solution state and the first infiltrating adjustment layer according to an embodiment of the present disclosure.
Figure 2B:
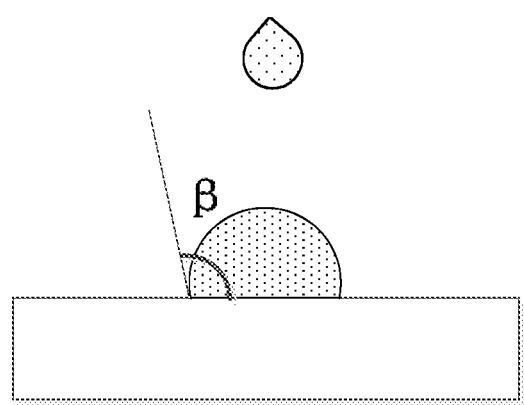
FIG. 2B is a schematic diagram of an infiltration angle $\beta$ between the touch electrodes in solution state and the substrate according to an embodiment of the present disclosure.

The embodiments of the present disclosure will be described in detail in combination with the accompanying drawings. FIG. 1A is a top view of a touch sensor according to an embodiment of the present disclosure, FIG. 1B is a sectional view taken along AA of FIG. 1, FIG. 2A is a schematic diagram of an infiltration angle $\alpha$ between a touch electrode in solution state and the first infiltrating adjustment layer according to an embodiment of the present disclosure, and FIG. 2B is a schematic diagram of an infiltration angle $\beta$ between the one of the touch electrodes in solution state and the substrate according to an embodiment of the present disclosure. It is to be noted that FIG. 1A merely illustrates four touch electrodes, which is merely an exemplary description, and structures such as connecting lines of the touch electrodes are omitted.

As shown in FIG. 1A and FIG. 1B, the touch sensor includes a substrate 100, and the substrate 100 has a plurality of grooves 101 which are strip-shaped and are intersected with each other to define a grid shape; and touch electrodes 102, which are formed in the grooves 101. Since the touch electrodes 102 are formed in the grooves 101, the touch electrodes filled in the plurality of intersected grooves are electrically connected to each other to form a touch electrode for detecting a touch position. The intersection of the grooves 101 is related to shapes of the required touch electrodes. As shown in FIG. 1A, five grooves extending along a first direction X and five grooves extending along a second direction Y are intersected with each other to form the shape of a touch electrode for position detection. However, the present disclosure neither limits the shape formed by intersecting the grooves, nor limits the number of the intersected grooves. The touch electrodes 102 may be a self-capacitive touch electrode, or may be a mutual-capacitive touch electrodes. When a touch electrode 102 is the mutual-capacitive touch electrode, the touch electrode 102 includes a touch drive electrode and a touch detection electrode to implement detection of the touch position, which is not limited in the present disclosure.

Referring to FIG. 1B, the touch sensor further includes a first infiltrating adjustment layer 103. The first infiltrating adjustment layer 103 is disposed on an inside wall of one of the grooves 101 and is positioned between the grooves 101 and one of the touch electrodes 102. As shown in FIG. 2A and FIG. 2B, an infiltration angle between a touch electrode in solution state and the first infiltrating adjustment layer 103 is α, an infiltration angle between the touch electrode in solution state and the substrate 100 is β, wherein α is not equal to β. Herein measurement of the infiltration angle is based on the same environmental condition. Optionally, α is less than the β, which may be implemented by setting the material of the first infiltrating adjustment layer 103 or by performing surface treatment on the surface of the substrate 100.

It is to be noted that surface infiltrating characteristics of matter refers to a capacity of a liquid to maintain contact with a solid surface. This surface contact capacity is embodied in an infiltration angle between the liquid and the solid surface. The less the infiltration angle is, the stronger the capacity of the liquid in contact with the solid surface is, and thus the liquid is more easily spread on the solid surface— the material is often referred to as hydrophilic. Herein, referring to FIG. 2A, the infiltration angle is defined as an included angle between a tangent line T1 of a gas-liquid interface at an intersection point O of three phases, i.e. gas, liquid and solid, and a solid-liquid border line T2 passing through the liquid. When α is less than β, the surface infiltrating characteristics of the touch electrodes in solution state and the first infiltrating adjustment layer 103 is better than the infiltrating characteristics of the touch electrodes in solution state and the surface of a substrate 100. The advantages of this setting is that on the one hand, when the electrode material solution is jetted and printed, if the electrode material solution is jetted and printed to outside of the groove, since the infiltrating characteristics of the electrode material solution to the substrate is worse than the infiltrating characteristics of the electrode material solution to the first infiltrating adjustment layer in the groove, the electrode material solution outside the grooves has a tendency to flowing towards inside of the groove, thereby ensuring the reliability of the fabrication process of the touch electrodes. In another aspect, the electrode material solution has good infiltrating characteristic with respect to the first infiltrating adjustment layer. Therefore, the electrode material solution can be evenly spread in the groove, thereby improving the uniformity of the touch electrodes and ensuring good touch performance of the touch sensor.

Optionally, a size relationship of the infiltration angle α between the touch electrode in solution state and the first infiltrating adjustment layer and the infiltration angle β between the touch electrode in solution state and the substrate satisfies with:

$$0°\leq\alpha\leq30°, 60°\leq\beta\leq180°$$

When $0°<\alpha<30°$, the electrode material solution is hydrophilic, can wet on the surface of the first infiltrating adjustment layer; and when $60°\leq\beta\leq180°$, the electrode material solution easily flows on the surface of the substrate. Optionally, $$0°\leq\alpha\leq10°, 90°\leq\beta\leq180°$$

When $0°\leq\alpha\leq10°$, the electrode material solution can be approximately completely infiltrated on the surface of the first infiltrating adjustment layer; and when $90°\leq\beta\leq180°$, the electrode material solution is not infiltrated or not completely infiltrated on the surface of the substrate. At this moment, a significantly different infiltration relationship exists between the electrode material solution on the surface of the first infiltrating adjustment layer and the electrode material solution on the surface of the substrate. The touch electrodes may be fabricated by entirely spraying the electrode material solution on the whole surface of the substrate. Because of the significantly different infiltration relationship between the electrode material solution on the surface of the first infiltrating adjustment layer and the electrode material solution on the surface of the substrate, droplets of the electrode material solution sprayed on the surface of the substrate may selectively flow into the groove due to non-infiltration with respect to the substrate, thereby forming the touch electrodes with a specific pattern, which greatly reduces the processing complexity.

Optionally, the first infiltrating adjustment layer 103 covers the whole surface of the inside wall of the groove, so that the electrode material solution can be evenly spread in the whole groove, which increases surface flatness of the touch sensor on one hand and enhances uniformity of the touch electrodes inside the groove on the other hand, thereby reducing the possibility of break of the touch electrodes.

Continuously referring to FIG. 1B, a depth d1 of the groove 101 is less than a thickness D of the substrate 100, and a thickness d2 of the first infiltrating adjustment layer is less than the depth d1 of the grooves 101. The depth d1 of the grooves 101 is less than the thickness D of the substrate, and the grooves 101 does not penetrate through the substrate 100, so that the substrate 100 can better bear the touch electrodes. The thickness d2 of the first infiltrating adjustment layer is less than the depth d1 of the grooves 101, which ensures that the first infiltrating adjustment layer 103 does not fully fill the grooves, so that the touch electrodes is formed in the grooves and the touch sensor has better flatness. Optionally, the thickness of the substrate is 1~50 nm, the depth of the grooves is 0.5~8 μm, and the thickness of the first infiltrating adjustment layer is 0.01~1 nm.

Figure 3A:
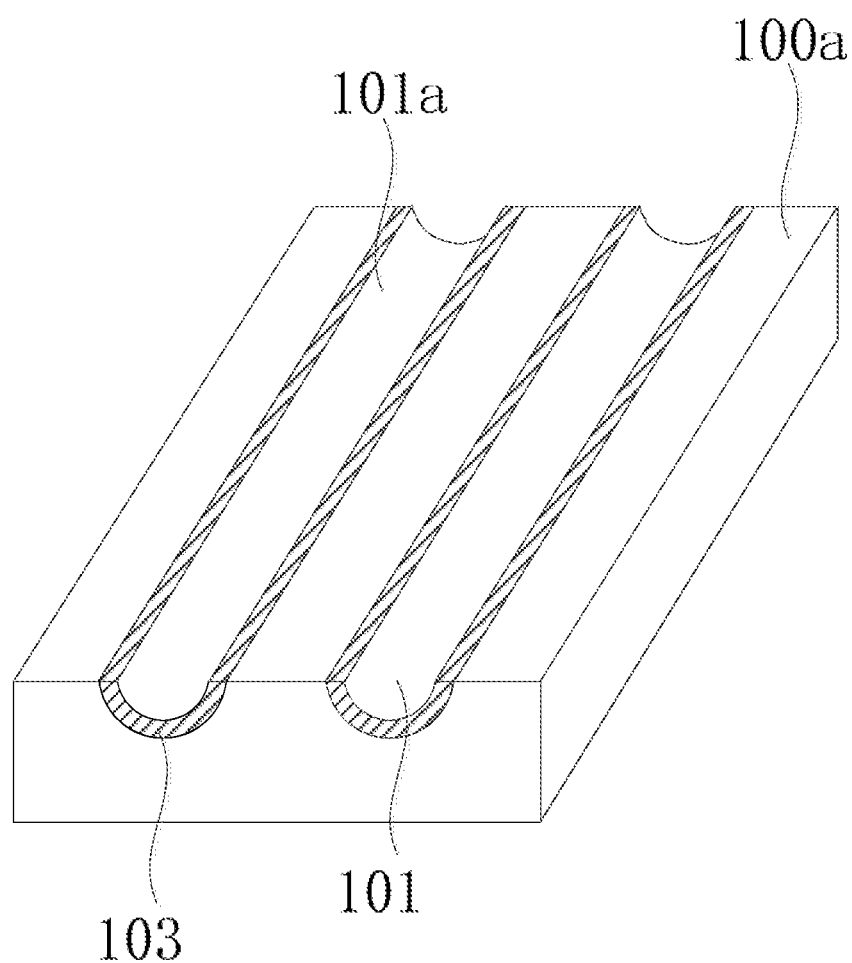
FIG. 3A is a schematic diagram of a grooves according to an embodiment of the present disclosure.
Figure 3B:
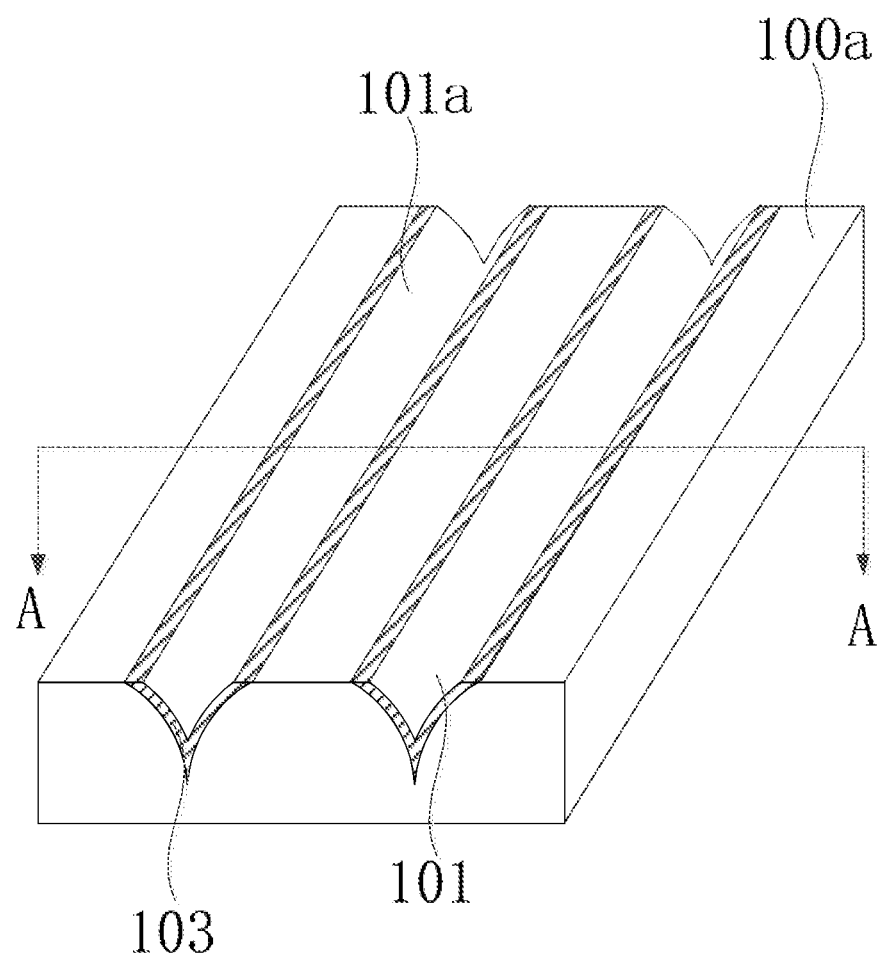
FIG. 3B is a schematic diagram of grooves according to another embodiment of the present disclosure.
Figure 3C:
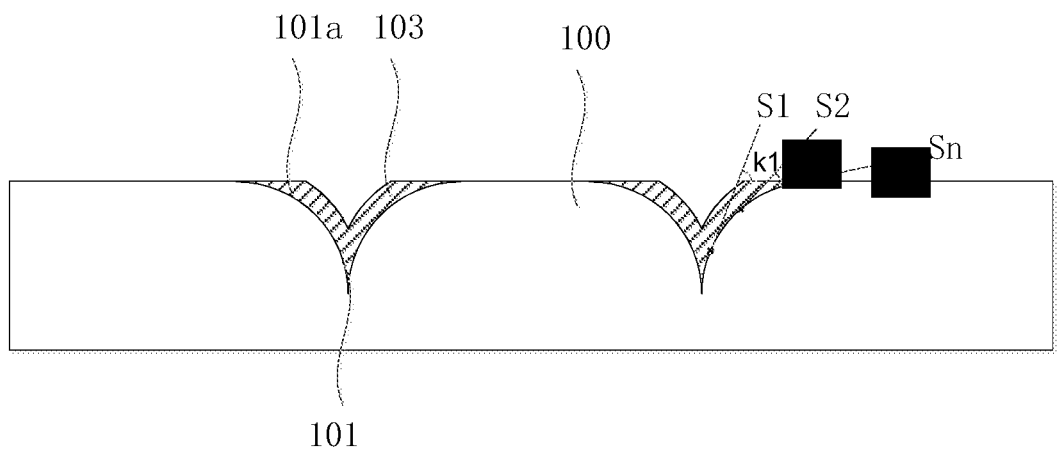
FIG. 3C is a cross sectional view taken along AA of FIG. 3B.

FIG. 3A is a schematic diagram of grooves according to an embodiment of the present disclosure, FIG. 3B is a schematic diagram of another grooves according to an embodiment of the present disclosure, and FIG. 3C is a sectional view taken along AA of FIG. 3B. As shown in FIG. 3A and FIG. 3B, the grooves 101 has a side wall 101a extending along a strip-shaped extension direction of the grooves, wherein the side wall 101a is a cambered surface. In this embodiment, the sidewall 101a of the grooves 101 is set as a cambered surface. The first infiltrating adjustment layer is disposed on the surface of the inside wall of the grooves. The first infiltrating adjustment layer has a cambered surface the same as, in shape, the inside wall of the grooves. The grooves having the shape of the cambered surface may effectively reduce intensity of pressure of the electrode material solution flowing inside the grooves, which is applied by the grooves. An inclination of the cambered surface of the grooves causes the pressure applied to the electrode material solution through the sidewall of the grooves to generate a component of the pressure of the electrode material solution and reduces a direct impact of the fluid on the grooves, thereby reducing a pressure difference resistance, so that the resistance of the fluid may be effectively reduced, and flow of the electrode material solution is accelerated, more advantageously allowing the electrode material solution to spread in the grooves.

Optionally, as shown in FIG. 3C, the cambered surface has a plurality of first tangent planes (such as S1, S2 . . . Sn in FIG. 3C). Gradients k1, k2 . . . kn of the plurality of first tangent planes along from the bottom of the grooves to the top of the grooves gradually decrease.

That is, k1>k2> . . . >kn.

When gradients k1, k2 and . . . kn of the plurality of first tangent planes along from the bottom of the grooves to the top of the grooves satisfy with the above conditions, the cambered surfaces of the sidewalls of the grooves protrude towards the top of the grooves. At this moment, pressure difference resistance of the sidewalls of the grooves against the liquid flowing inside the grooves is the minimum, the first infiltrating adjustment layer 103 disposed inside the grooves ensures spreading uniformity of the electrode material solution, and the cambered surfaces of the sidewalls of the grooves maximizes the fluidity of the electrode material solution in the grooves, thereby ensuring the process reliability of the touch electrodes.

As shown in FIG. 3C, the number of the sidewalls 101a of the grooves 101 are two, and the two sidewalls 101a of the grooves 101 are intersected at the bottom of the grooves 101, so that the formed bottom of the grooves is not a plane, and the first infiltrating adjustment layer 103 formed on the surfaces of the sidewalls 101a of the grooves has component of pressure applied to the electrode material solution through the sidewall of the grooves in each position, thereby further reducing the resistance of the sidewalls of the grooves against the electrode material solution and enhancing the fluidity of the electrode material solution inside the grooves 101.

Optionally, in the embodiments of the present disclosure, the first infiltrating adjustment layer 103 covers the whole surface of the inside wall of the grooves 101. Since the first infiltrating adjustment layer 103 has an infiltrative regulating effect on the electrode material solution dripping into the grooves, when the first infiltrating adjustment layer 103 covers the whole surface of the inside wall of the grooves, the electrode material solution in the grooves may have good and uniform wettability or fluidity. It is to be understood that an embodiment of the present disclosure also may be that the first infiltrating adjustment layer 103 can cover a part of the surface of the inside wall of the grooves 101, which is not limited by the present disclosure.

the first infiltrating adjustment layer 103 may be made of inorganic material. When the material of the first infiltrating adjustment layer 103 is the inorganic material, the first infiltrating adjustment layer has good infiltration characteristic with respect to the electrode material solution. When the electrode material solution flows on the surface of the first infiltrating adjustment layer 103, the electrode material solution can be uniformly spread on the surface of the first infiltrating adjustment layer 103. Exemplarily, the inorganic material may be at least one of silicon nitride, silicon oxide, silicon oxynitride, aluminium oxide or titanium dioxide. The material of the first infiltrating adjustment layer also may be organic material. When the material of the first infiltrating adjustment layer is the organic material, the first infiltrating adjustment layer has poor infiltration characteristic with respect to the electrode material solution. In this case, the electrode material solution can quickly flow on the surface of the first infiltrating adjustment layer 103, which is advantageous to the fabrication process of the touch electrodes. Exemplarily, the organic material includes at least one of: polytetrafluoroethylene, perfluoro alkoxyl alkane, perfluoro ethylene-propylene copolymer, ethylene-tetrafluoroethylene copolymer, polyvinylidene fluoride, polychlorotrifluoroethylene, ethylene-trifluoroethylene copolymer, polytetrachloroethylene-perfluorodioxole copolymer and polyvinyl fluoride.

Figure 4:
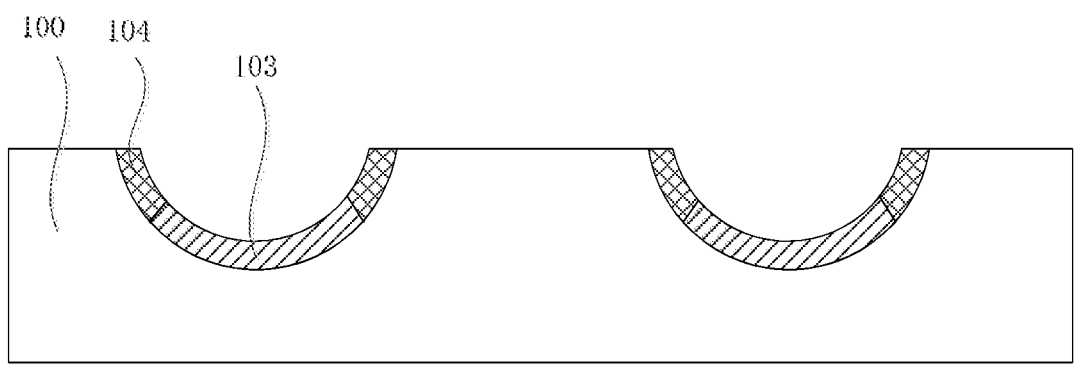
FIG. 4 is a schematic diagram of grooves according to another embodiment of the present disclosure.

FIG. 4 is a schematic diagram of still another groove according to an embodiment of the present disclosure. As shown in FIG. 4, a second infiltrating adjustment layer 104 is further provided on the surface of the inside wall of the grooves 101. The first infiltrating adjustment layer 103 does not completely overlap with the second infiltrating adjustment layer 104. An infiltration angle between the touch electrodes in solution state and the second infiltrating adjustment layer 104 is $\alpha 1$, and an infiltration angle between the touch electrodes in solution state and the first infiltrating adjustment layer 103 is $\alpha$, wherein $\alpha 1$ is not equal to $\alpha$. In this embodiment, the infiltration angle between the touch electrodes in solution state and the first infiltrating adjustment layer 103 is different from the infiltration angle between the touch electrodes in solution state and the second infiltrating adjustment layer 104, which can simultaneously implement the regulation of the fluidity and wettability of the electrode material solution.

Specifically, when the infiltration angle between liquid and solid matter surface is smaller, the liquid can be evenly spread on the solid matter surface, namely, having good wettability. When the infiltration angle between the liquid and the solid matter surface is larger, that is, the liquid is not easily compatible with the solid matter surface. At this moment, the liquid has good fluidity on the solid matter surface. In this embodiment, two types of infiltrating adjustment layers different in infiltration angle are simultaneously disposed in one grooves, which not only can allow the electrode material solution to have good wettability in the grooves, but also can accelerate the fluidity of the electrode material solution in the grooves. A good fluidity reduces the process difficulty of the touch electrodes and allows the locally dripped electrode material solution to quickly flow and evenly spread, thereby enhancing the overall uniformity of the touch electrodes. When the electrode material solution has a larger infiltration angle difference on the surfaces of the first infiltrating adjustment layer 103 and the second infiltrating adjustment layer 104, the first infiltrating adjustment layer 103 and the second infiltrating adjustment layer 104 have a good regulating effect on fluidity and wettability of the electrode material solution.

The numerical range of the infiltration angle $\alpha$ between the touch electrodes in solution state and the first infiltrating adjustment layer 103 is $0° \leq \alpha \leq 30°$, and the numerical range of the infiltration angle $\alpha 1$ between the touch electrodes in solution state and the second infiltrating adjustment layer 104 is $60° \leq \alpha 1 \leq 180°$. When $0° \leq \alpha \leq 30°$, the electrode material solution can be wet the surface of the first infiltrating adjustment layer 103; and when $60° \leq \alpha 1 \leq 180°$, the electrode material solution easily flows on the surface of the second infiltrating adjustment layer 104.

The numerical range of the infiltration angle $\alpha$ between the touch electrodes in solution state and the first infiltrating adjustment layer 103 is $0° \leq \alpha \leq 10°$, and the numerical range of the infiltration angle $\alpha 1$ between the touch electrodes in solution state and the second infiltrating adjustment layer 104 is $90° \leq \alpha 1 \leq 180°$. When $0° \leq \alpha \leq 10°$, the electrode material solution can be approximately completely infiltrated on the surface of the first infiltrating adjustment layer and has good wettability; and when $90° \leq \alpha 1 \leq 180°$, the electrode material solution is not infiltrated or not completely infiltrated on the surface of the second infiltrating adjustment layer 104, but having the best fluidity. It is to be noted that when the infiltration angle between the touch electrodes in solution state and the first infiltrating adjustment layer 103 is less than that between the touch electrodes in solution state and the second infiltrating adjustment layer 104, the second infiltrating adjustment layer may have the same material as the substrate, and the infiltration angle between the touch electrodes in solution state and the substrate may be equal to or approximately equal to the infiltration angle between the touch electrodes in solution state and the second infiltrating adjustment layer 104.

When the infiltration angle between the touch electrodes in solution state and the first infiltrating adjustment layer 103 is less than that between the touch electrodes in solution state and the second infiltrating adjustment layer 104, the material of the first infiltrating adjustment layer may be inorganic material, and the material of the second infiltrating adjustment layer may be organic material. When the infiltration angle between the touch electrodes in solution state and the first infiltrating adjustment layer 103 is greater than that between the touch electrodes in solution state and the second infiltrating adjustment layer 104, the material of the first infiltrating adjustment layer may be the organic material, and the material of the second infiltrating adjustment layer may be the inorganic material. The inorganic material includes at least one of: silicon nitride, silicon oxide, silicon oxynitride, aluminium oxide or titanium dioxide. The organic material includes at least one of: polytetrafluoroethylene, perfluoro alkoxyl alkane, perfluoro ethylene-propylene copolymer, ethylene-tetrafluoroethylene copolymer, polyvinylidene fluoride, polychlorotrifluoroethylene, ethylene-trifluoroethylene copolymer, polytetrachloroethylene-perfluorodioxole copolymer and polyvinyl fluoride.

As shown in FIG. 4, the first infiltrating adjustment layer 103 and the second infiltrating adjustment layer 104 together cover the inside wall of the grooves 101. A thickness of the first infiltrating adjustment layer 103 is equal to that of the second infiltrating adjustment layer 104. FIG. 4 illustrates that the first infiltrating adjustment layer 103 is disposed at the bottom of the grooves, and the second infiltrating adjustment layer is disposed on sidewalls at two sides of each groove. In an optional implementation of this embodiment, alternatively, the second infiltrating adjustment layer 104 is disposed at the bottom of the grooves, and the first infiltrating adjustment layer 103 is disposed on sidewalls at two sides of the grooves, or the first infiltrating adjustment layer 103 and the second infiltrating adjustment layer 104 are alternatively disposed on the surface of the inside wall of the grooves, which is not limited by the present disclosure. By simultaneously setting the first infiltrating adjustment layer and the second infiltrating adjustment layer, regulation of the fluidity and wettability of the electrode material solution in the grooves can be implemented, and the stability of forming the touch electrodes is guaranteed.

In the embodiments of the present disclosure, the material of the substrate may be an organic material, the substrate may be formed by means of inkjet printing, and the grooves on the surface of the substrate may be formed at the same time in the process of forming the substrate.

Figure 5:
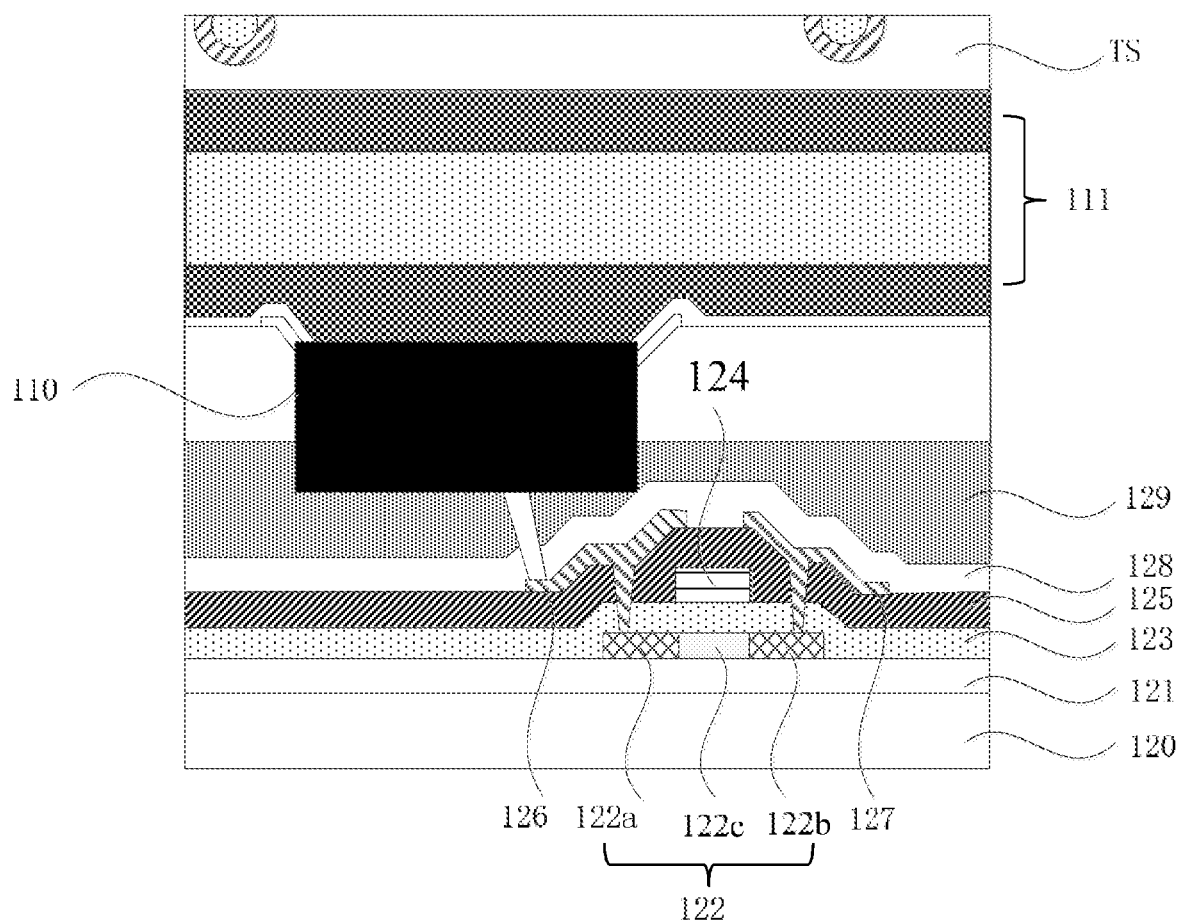
FIG. 5 is a touch display panel according to the embodiments of the present disclosure.

FIG. 5 is a touch display panel according to an embodiment of the present disclosure, which includes any one of the foregoing touch sensors. The touch display panel may be an organic light emitting display panel, including an organic light-emitting device 110 and a thin-film encapsulation layer 111 covering the organic light-emitting device 110. The touch sensor TS is directly formed on the surface of the thin-film encapsulation layer 111.

The touch display panel provided by this embodiment may be an organic light-emitting diode display panel. The touch display panel includes a substrate 120, which may be a flexible substrate. The flexible substrate may be formed by any suitable insulating material has flexibility. For example, the flexible substrate may be formed by polymer materials such as polyimide (PI), polycarbonate (PC), polyethersulfone (PES), polyethylene terephthalate (PET), polyethylene naphthalene (PEN), polyarylate (PAR) or glass fiber reinforced plastic (FRP). The flexible substrate may be transparent, semitransparent or nontransparent. The flexible substrate allows the touch display panel to implement flexible display such as bending, curling and folding.

A buffer layer 121 is positioned on the flexible substrate. The buffer layer 121 may cover the whole upper surface of the flexible substrate. In an embodiment, the buffer layer includes an inorganic layer or an organic layer. For example, the buffer layer may be formed by materials selected from inorganic materials such as silicon oxide ($SiO_x$), silicon nitride ($SiN_x$), silicon oxynitride ($SiO_xN_y$), aluminium oxide ($AlO_x$) or aluminum nitride ($AlN_x$) or from organic materials such as acryl, polyimide (PI) or polyester. The buffer layer 121 may include a single layer or a plurality of layers. The buffer layer obstructs oxygen and moisture, preventing moisture or impurities from diffusing through the flexible substrate and provides a flat surface on the upper surface of the flexible substrate.

A thin film transistor (TFT) is positioned on the buffer layer 121. In the embodiments of the present disclosure, reference is made to the structure by taking a top-gate TFT as an example.

The TFT includes a semiconductor active layer 122 positioned on the buffer layer 121. The semiconductor active layer 122 includes a source region 122a and a drain region 122b formed by doping with N-type impurity ions or P-type impurity ions. A region between the source region 122a and the drain region 122b is a channel region 122c not doped with impurities.

The semiconductor active layer 122 may be formed by means of crystallization of amorphous silicon so that the amorphous silicon is transformed into polysilicon.

Various methods may be used to crystallize the amorphous silicon, for example, rapid thermal annealing (RTA), solid phase crystallization (SPC), laser including excimer laser annealing (ELA), metal induced crystallization (MIC), metal induced lateral crystallization (MILC), or sequential lateral solidification (SLS), etc.

A gate insulation layer 123 includes an inorganic layer such as silicon oxide, silicon nitride or metal oxide, and may include a single layer or a plurality of layers.

A gate electrode 124 is positioned in a particular region on the gate insulation layer 123. The gate electrode 124 may include a single layer or a plurality of layers of gold (Au), silver (Ag), copper (Cu), nickel (Ni), platinum (Pt), palladium (Pd), aluminum (Al), molybdenum (Mo) or chromium (Cr), or alloy such as aluminum (Al)-neodymium (Nd) alloy or molybdenum (Mo)-tungsten (W) alloy.

An interlayer insulating layer 125 is positioned on the gate electrode 124. The interlayer insulating layer 125 may be formed by an insulating inorganic layer of silicon oxide or silicon nitride. Optionally, the interlayer insulating layer may be formed by an insulating organic layer.

A source electrode 126 and a drain electrode 127 are positioned on the interlayer insulating layer 125. The source electrode 126 and the drain electrode 127 are electrically connected (or coupled) to the source region and the drain region respectively via a contact hole. The contact hole is formed by selectively removing the gate insulation layer and the interlayer insulating layer.

A passivation layer 128 is positioned on the source electrode and the drain electrode. The passivation layer 128 may be formed by an inorganic layer of silicon oxide or silicon nitride or an organic layer.

A planarization layer 129 is positioned on the passivation layer 128. The planarization layer 129 includes an organic layer of acryl, polyimide (PI) or benzo-cyclobutene (BCB). The planarization layer 129 has a function of planarization.

An organic light-emitting device is formed on the TFT.

A thin-film encapsulation layer is positioned on the organic light-emitting device. In an embodiment, the thin-film encapsulation layer protects a light-emitting layer and other thin layers from external moisture and oxygen, etc.

Generally, the touch sensor directly formed inside the touch display panel is formed by means of evaporation and etching. These processes include a wet process such as cleaning. The thin-film encapsulation layer needs to have excellent performance in obstructing water vapor and oxygen so that the wet process is ensured not to have a negative effect on the organic light-emitting device inside the thin-film encapsulation layer, which undoubtedly has high process difficulty. The structure of the touch sensor TS provided by the present disclosure may be formed by way of inkjet printing. Therefore, when the touch sensor TS is directly formed on the surface of the thin-film encapsulation layer, no negative effect may be caused to the light-emitting element layer, thereby reducing requirements for the encapsulation performance of the thin-film encapsulation layer. The touch sensor TS has a substrate which includes a plurality of strip-shaped grooves intercrossing to constitute a grid shape. To wet the groove surface for an adjustable contact angle, a first infiltrating adjustment layer is disposed on the grooves' surface. The touch electrodes is formed inside the grooves by way of inkjet printing. The first infiltrating adjustment layer can regulate fluidity and wettability of the touch electrodes in the grooves. The formed touch electrodes have good process stability. The touch electrodes are formed inside the grooves and the surface of the touch sensor TS has good flatness, which provides favorable conditions for subsequent film layer preparation processes of the touch display panel. The substrate has a plurality of grooves, which enhances the bending resistance of the touch sensor, making it advantageous to flexible display of the touch display panel.

Generally, metallic materials are selected for the touch electrodes. In the embodiments of the present disclosure, by directly forming the touch sensor TS having the above structure on the surface of the thin-film encapsulation layer, the overall thickness of the touch display panel can be reduced, and integration of the display panel and the touch sensor can be implemented. The touch sensor TS formed on the thin-film encapsulation layer is positioned between a circular polarizer and the light-emitting element layer of the touch display panel, which can reduce reflection of external environment light on the metal touch electrodes and reduce the phenomenon of graphical visibility.

Figure 6:
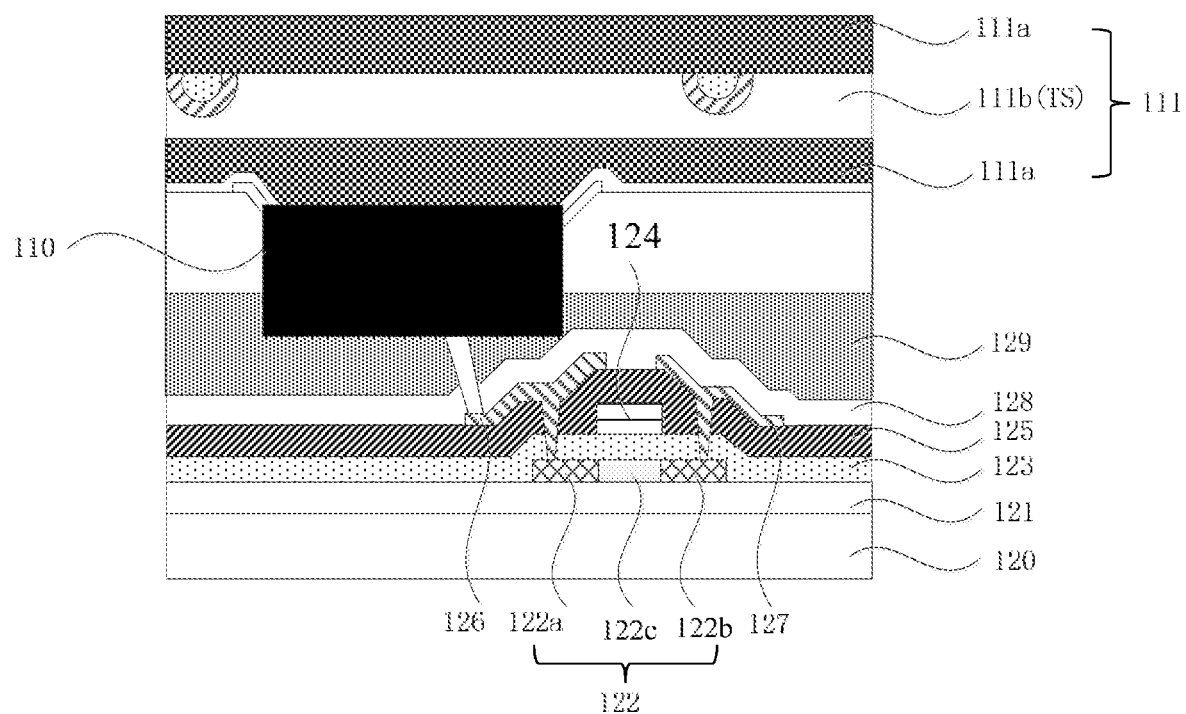
FIG. 6 is another touch display panel according to the embodiments of the present disclosure.

FIG. 6 is another touch display panel according to an embodiment of the present disclosure. Different from the embodiment as shown in FIG. 5, the thin-film encapsulation layer 111 includes at least one organic layer 111a and at least two inorganic layers 111b. The organic layer 111a is positioned between the two inorganic layers 111b. The substrate of the touch sensor TS is the organic layer 111a. In this embodiment of the present disclosure, the touch electrodes is disposed inside the thin-film encapsulation layer, and the organic layer is also used as the substrate of the touch sensor. On one hand, corrosion of external water vapor and oxygen on the touch electrodes may be avoided, and on the other hand, the thickness of the touch display panel may be furthest reduced, which conforms to the development trend to light weight and slim design. The touch electrodes are disposed inside the first grooves of an organic layer of the thin-film encapsulation layer. Therefore, the risk of fracture of the touch electrodes in the process of bending may be significantly reduced.

Figure 7:
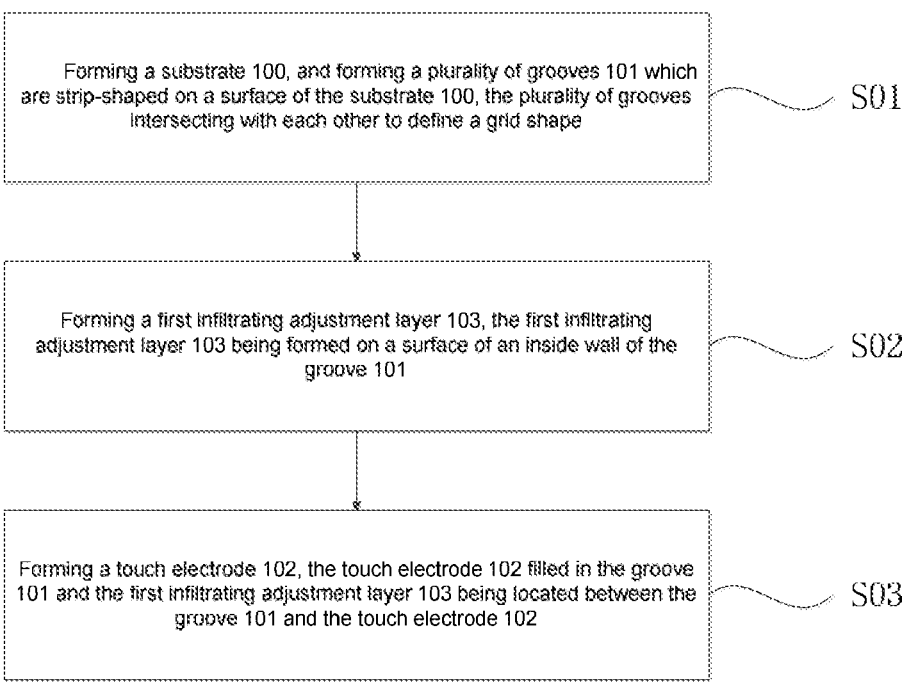
FIG. 7 is a schematic flowchart of a method for fabricating a touch sensor according to the embodiments of the present disclosure.

The present disclosure further provides a method for fabricating a touch sensor. FIG. 7 is a schematic flowchart of a method for fabricating a touch sensor according to an embodiment of the present disclosure, as shown in FIG. 7, the fabricating method includes:

S01: forming a substrate 100;

forming a plurality of grooves 101 which are strip-shaped on a surface of the substrate 100, where the plurality of grooves are intersected with each other to define a grid shape;

S02: forming a first infiltrating adjustment layer 103, where the first infiltrating adjustment layer 103 is formed on an inside wall of the grooves 101; and S03: forming a touch electrodes 102, where the touch electrodes 102 is filled in the grooves 101, and the first infiltrating adjustment layer 103 is positioned between the grooves 101 and the touch electrodes 102.

An infiltration angle between the touch electrodes 102 in solution state and the first infiltrating adjustment layer 103 is α, and an infiltration angle between the touch electrodes 102 in solution state and the substrate 100 is β, wherein α is not equal to β.

In Step S01, the substrate 100 and the grooves 101 on the surface of the substrate 100 may be formed at the same time by means of inkjet printing. The material of the substrate 100 is dissolved into a solvent to form ink droplet solution of the substrate, the ink droplet solution is jetted and the jetted ink droplet solution is cured. In this way, the substrate and the grooves are formed. The shape and the depth of the formed grooves may be controlled by controlling an ink droplet size of the jetted ink droplet solution and the curing time of the ink droplet solution. Using the inkjet printing can freely and flexibly control the thickness of the formed substrate, the shape of the grooves, a pitch of the grooves and the like. The substrate and the grooves on the surface of the substrate may be formed by one-shot process without multi-step processes such as evaporation and etching.

In Step S02, the step of forming the first infiltrating adjustment layer 103 includes: forming the whole first infiltrating adjustment layer on the surface of the substrate 100, etching the whole first infiltrating adjustment layer so that the first infiltrating adjustment layer is formed in the grooves 101.

In Step S03, the step of forming the touch electrodes includes: dissolving the material of the touch electrodes into the organic solvent to form electrode material solution of the touch electrodes, and jetting the electrode material solution into the grooves by way of inkjet printing.

Generally, the touch electrodes of the touch sensor is directly formed on the surface of the substrate of the touch sensor. The material of the touch electrodes includes transparent indium tin oxide. However, in a flexible display panel, a metal grid electrode having good flexibleness and low impedance may be used so as to enhance the bending resistance of the touch electrodes. The fabricating process of the metal grid may adopt a manner of screen printing directly using metal ink. Alternatively, the entire metal may be coated on the substrate thin film and then redundant components are washed away via a yellow light photolithography process to generate the grid. No matter which manner is used, the above manners may cause a negative impact on the light-emitting element if the metal grid electrode is directly formed inside the organic light emitting display panel.

In the embodiments of the present disclosure, the touch electrodes is formed inside the grooves on the substrate by way of inkjet printing. The grooves may be a strip-shaped grooves. And a plurality of strip-shaped grooves intercross to form a grid shape. The number of intercrossed grooves and the shape of the grid formed by intercrossing depend on the shape of the touch electrodes used for touch position detection. The electrode material of the touch electrodes may be metal, and optionally may be metallic materials such as gold, silver or copper, etc. the organic solvent is one of: ethyl cellulose, cellulose nitrate, polyvinyl acetate, ketone resin and polyphthalein amine resin. The electrode material of the touch electrodes is dissolved into to the organic solvent to form the electrode material solution of the touch electrodes, and then the electrode material solution is jetted and printed into the grooves of the substrate. The electrode material solution may be jetted and printed at the crossover region of the grooves so that liquid flowing into the grooves rapidly flows along the inside wall of the grooves to form a uniform electrode shape, which is then cured, and the organic solvent volatilizes. In this way, the touch electrodes is formed.

In the embodiments of the present disclosure, before the electrode material solution is jetted and printed into the grooves, a first infiltrating adjustment layer is formed on the inside wall of the grooves. The first infiltrating adjustment layer can regulate infiltrating characteristics of the electrode material solution with respect to the grooves. In this way, a flow rate and a spreading uniformity of the electrode material solution in the grooves are regulated and controlled, the uniformity of the formed touch electrodes is guaranteed, a possibility of disconnection of the touch electrodes is reduced, each touch electrodes is ensured to have a uniform impedance, and a touch performance of the touch sensor is improved.

Material of the first infiltrating adjustment layer 103 may be an inorganic matter. When the material of the first infiltrating adjustment layer 103 is the inorganic matter, the first infiltrating adjustment layer has good infiltration characteristic with respect to the electrode material solution. When the electrode material solution flows on the surface of the first infiltrating adjustment layer 103, the electrode material solution can be uniformly spread on the surface of the first infiltrating adjustment layer 103. Exemplarily, the inorganic matter may be at least one of silicon nitride, silicon oxide, silicon oxynitride, aluminium oxide or titanium dioxide. The material of the first infiltrating adjustment layer also may be an organic matter. When the material of the first infiltrating adjustment layer is the organic matter, the first infiltrating adjustment layer has poor infiltration characteristic with respect to the electrode material solution. In this case, the electrode material solution can quickly flow on the surface of the first infiltrating adjustment layer 103, which is advantageous to the fabrication process of the touch electrodes. Exemplarily, the organic matter includes at least one of: polytetrafluoroethylene, perfluoro alkoxyl alkane, perfluoro ethylene-propylene copolymer, ethylene-tetrafluoroethylene copolymer, polyvinylidene fluoride, polychlorotrifluoroethylene, ethylene-trifluoroethylene copolymer, polytetrachloroethylene-perfluorodioxole copolymer and polyvinyl fluoride.

It is noted that the foregoing embodiments are merely preferred embodiments of the present disclosure and technical principles used thereby. Persons skilled in the art may understand that the present disclosure is not limited to the specific embodiments described herein, and persons skilled in the art may make various obvious changes, readjustments and substitutions without departing from the scope of protection of the present disclosure. Therefore, although reference is made to the present disclosure in more detail in the foregoing embodiments, the present disclosure is not merely limited to the foregoing embodiments, other more equivalent embodiments may be further included without departing from the conception of the present disclosure, and the scope of the present invention depends on the scope of the appended claims.

The invention claimed is:

1. A touch sensor, comprising:
   a substrate having a first area and a second area, wherein the first area has a plurality of grooves and the second area has no grooves;
   a first infiltrating adjustment layer disposed on inside walls of the plurality of grooves in the first area; and
   a plurality of touch electrodes disposed directly on the first infiltrating adjustment layer inside the plurality of grooves;
   wherein the touch electrodes are not in contact with the substrate;
   wherein the plurality of touch electrodes is formed by dissolving a touch electrode material by a solvent from a solid state into a solution state, so the touch electrode in the solution state is in contact with the first infiltrating adjustment layer in the plurality of grooves and is also in contact with the substrate in the second area; and
   wherein during forming of the plurality of touch electrodes, an infiltration angle of the touch electrode in the solution state is an included angle between a tangent line T1 of a gas-liquid interface at an intersection point O of gas phase, liquid phase and solid phase, and a solid-liquid border line T2 passing through the touch electrode in the solution state, wherein the infiltration angle between each touch electrode in the solution state and the first infiltrating adjustment layer is $\alpha$, the infiltration angle between each touch electrode in the solution state and the substrate is $\beta$, wherein $\alpha$ is not equal to $\beta$, and $\alpha$ and $\beta$ are constant when the touch electrodes are in the solution state.

2. The touch sensor according to claim 1, wherein a depth of the plurality of grooves is less than a thickness of the substrate, and a thickness of the first infiltrating adjustment layer is less than the depth of the grooves.

3. The touch sensor according to claim 1, wherein the plurality of grooves each has a strip-shape and the sidewall of the groove extends along the strip direction, and the inside surface of the groove is a cambered surface.

4. The touch sensor according to claim 3, wherein the cambered surface has a plurality of first tangent planes, gradients of the plurality of first tangent planes decreases gradually from a bottom of the groove to a top of the groove.

5. The touch sensor according to claim 4, wherein each of the grooves has two sidewalls, and the two sidewalls are crossed with each other at the bottom of the grooves.

6. The touch sensor according to claim 1, wherein the first infiltrating adjustment layer covers the whole inside surface of the groove.

7. The touch sensor according to claim 1, wherein $\alpha$ is less than $\beta$.

8. The touch sensor according to claim 7, wherein $0°\leq\alpha\leq30°$, $60°\leq\beta\leq180°$.

9. The touch sensor according to claim 8, wherein $0°\leq\alpha\leq10°$, $\pi°\leq\beta\leq180°$.

10. The touch sensor according to claim 1, further comprising:
    a second infiltrating adjustment layer disposed on the inside surface of at least one of the plurality of grooves, wherein the first infiltrating adjustment layer and the second infiltrating adjustment layer are not intersected; and an infiltration angle between one of the plurality of touch electrodes in the solution state and the second infiltrating adjustment layer is al, and al is not equal to a.

11. The touch sensor according to claim 10, wherein α is less than α1.

12. The touch sensor according to claim 11, wherein $0°≤α≤30°, 60°≤α1≤180°$.

13. The touch sensor according to claim 1, wherein
the electrode material is a metal material; and
the solvent is organic and selected from one of: ethyl cellulose, cellulose nitrate, polyvinyl acetate, ketone resin and polyamide resin.

14. The touch sensor according to claim 10, wherein
the first infiltrating adjustment layer is made of an organic material, and the second infiltrating adjustment layer is made of an inorganic material; or
the first infiltrating adjustment layer is made of inorganic matter, and the second infiltrating adjustment layer is made of organic matter.

15. A touch display panel, comprising the touch sensor according to claim 1, further comprising,
an organic light-emitting device and a thin-film encapsulation layer covering the organic light-emitting device, wherein the touch sensor is directly formed on a surface of the thin-film encapsulation layer.

* * * * *